United States Patent
Galiano et al.

(10) Patent No.: US 10,497,977 B2
(45) Date of Patent: Dec. 3, 2019

(54) SPECIFIC IONIC LIQUID AND METHOD FOR PRODUCING SAME

(71) Applicants: COMMISSARIAT A L'ENERGIE ATOMIQUE ET AUX ENERGIES ALTERNATIVES, Paris (FR); UNIVERSITE FRANCOIS RABELAIS, Tours (FR)

(72) Inventors: Hervé Galiano, La Ville Aux Dames (FR); Mériem Anouti, Saint Avertin (FR)

(73) Assignees: Commissariat a L'Energie Atomique et aux Energies Alternatives, Paris (FR); Universite Francois Rabelais, Tours (FR)

( * ) Notice: Subject to any disclaimer, the term of this patent is extended or adjusted under 35 U.S.C. 154(b) by 413 days.

(21) Appl. No.: 15/319,262

(22) PCT Filed: Jun. 16, 2015

(86) PCT No.: PCT/EP2015/063449
§ 371 (c)(1),
(2) Date: Dec. 15, 2016

(87) PCT Pub. No.: WO2015/193293
PCT Pub. Date: Dec. 23, 2015

(65) Prior Publication Data
US 2017/0149090 A1 May 25, 2017

(30) Foreign Application Priority Data

Jun. 16, 2014 (FR) .................. 14 55489

(51) Int. Cl.
*H01M 10/056* (2010.01)
*H01M 10/0568* (2010.01)
(Continued)

(52) U.S. Cl.
CPC ........ *H01M 10/0568* (2013.01); *H01B 1/122* (2013.01); *H01G 9/035* (2013.01);
(Continued)

(58) Field of Classification Search
None
See application file for complete search history.

(56) References Cited

U.S. PATENT DOCUMENTS

2011/0143196 A1 6/2011 Okumura et al.
2015/0187514 A1 7/2015 Galiano et al.

FOREIGN PATENT DOCUMENTS

EP    2388853 A1    11/2011

OTHER PUBLICATIONS

Binnemans, K., "Ionic Liquid Crystals", Nov. 9, 2005, pp. 4148-4204, vol. 105, No. 11, Publisher: Chemical Reviews.
(Continued)

*Primary Examiner* — Wyatt P McConnell
(74) *Attorney, Agent, or Firm* — Alston & Bird, LLP (57) ABSTRACT

The invention relates to an ionic liquid, comprising the association of a cation, chosen from the following cations of formulas (I) to (III): in which: —$R^1$ to $R^4$ for formulas (I) and (II), and $R^1$ to $R^3$ for formula (III) represent, independently from one another, a hydrogen atom or an aliphatic or cyclic hydrocarbon group, under the condition that at least one of the groups $R^1$ to $R^4$, for formulas (I) and (II) and at least one of the groups $R^1$ to $R^3$ for formula (III) represents an aliphatic hydrocarbon group comprising at least two carbon atoms and at least one of the groups $R^1$ to $R^4$ for formulas (I) and (II) and at least one of the groups $R^1$ to $R^3$ for formula (III) represents a hydrogen atom; and an anion chosen from the following anions of formulas (IV) and (V):

(Continued)

in which: —$R^5$ is a cyclic hydrocarbon group; —n1 is an integer equal to 1, 2, 3, 4, 5 or 6; and—n2 is an integer equal to 1, 2, 3 or 4.

22 Claims, 3 Drawing Sheets

(51) Int. Cl.

| | |
|---|---|
| *H01G 9/035* | (2006.01) |
| *H01G 11/58* | (2013.01) |
| *H01B 1/12* | (2006.01) |
| *H01M 10/052* | (2010.01) |
| *H01G 11/62* | (2013.01) |
| *H01L 31/0224* | (2006.01) |
| *H01M 10/0525* | (2010.01) |
| *H01M 10/0569* | (2010.01) |

(52) U.S. Cl.
CPC ............ *H01G 11/58* (2013.01); *H01G 11/62* (2013.01); *H01L 31/022425* (2013.01); *H01M 10/052* (2013.01); *H01M 10/0525* (2013.01); *H01M 10/0569* (2013.01); *H01M 2300/0045* (2013.01); *Y02E 60/13* (2013.01)

(56) References Cited

OTHER PUBLICATIONS

Li, M., et al., "Polymer Gel Electrolytes Containing Sulfur-Based Ionic Liquids in Lithium Battery Applications at Room Temperature", Feb. 21, 2013, pp. 515-521, vol. 43.

SPECIFIC IONIC LIQUID AND METHOD FOR PRODUCING SAME

CROSS-REFERENCE TO RELATED APPLICATIONS

This application is a U.S. national phase under the provisions of 35 U.S.C. § 371 of International Patent Application No. PCT/EP15/63449 filed Jun. 16, 2015, which in turn claims priority of French Patent Application No. 1455489 filed Jun. 16, 2014. The disclosures of such international patent application and French priority patent application are hereby incorporated herein by reference in their respective entireties, for all purposes.

TECHNICAL FIELD

The present invention is directed towards novel ionic liquids resulting from the association between a specific cation and a specific anion, these ionic liquids having good conductivity properties, low viscosity and wide-ranging electroactivity domain.

It is therefore only natural that these ionic liquids should find application as electrolytes in energy storage devices such as lithium-sulfur batteries, or in solar devices such as solar cells with photosensitive dyes.

Ionic liquids are salts in the liquid state at ambient temperature, these ionic liquids able to be represented by the following general formula:

$$A^+X^-$$

where:
 $A^+$ is a generally organic cation; and
 $X^-$ is an organic or mineral anion.

Ideally, they have no measurable vapour tension and have extensive thermal stability, which means that the environmental and safety problems encountered with organic solvents (whether in terms of volatility, evaporation and risks of flammability or explosion) are thereby eliminated. They can therefore be qualified as green solvents.

However, ionic liquids may have high viscosity and hence low ionic conductivity leading to strong resistances at ambient temperature.

These disadvantages can be overcome, at least in part, by using protic ionic liquids, in particular those derived from a proton transfer reaction between a BrØnsted acid and base. Since it is possible to act on the type of acids and bases involved in the transfer reaction, these ionic liquids can exhibit properties that can be modulated in terms of viscosity and conductivity in particular, predisposing them for inclusion in the composition of proton-conducting electrolytes particularly adapted for employment over a wide range of temperatures of use.

Having regard to already existing solutions, the authors of the present invention have developed a novel class of ionic liquids which, in particular, meet the aforementioned characteristics and additionally allow high power densities and energy densities to be obtained when used as electrolytes in energy storage devices.

DESCRIPTION OF THE INVENTION

These novel ionic liquids therefore comprise the association of a cation selected from among the cations of following formulas (I) to (III):

(I)

(II)

(III)

with an anion selected from among the anions of following formulas (IV) and (V):

(IV)

(V)

where:
 $R^1$ to $R^4$ for formulas (I) and (II) and $R^1$ to $R^3$ for formula (III) are each independently a hydrogen atom or an aliphatic or cyclic hydrocarbon group, provided that at least one of groups $R^1$ to $R^4$ for formulas (I) and (II), and at least one of groups $R^1$ to $R^3$ for formula (III) represent an aliphatic hydrocarbon group having at least two carbon atoms, and at least one of groups $R^1$ to $R^4$ for formulas (I) and (II) and at least one of groups $R^1$ to $R^3$ for formula (III) represent a hydrogen atom;
 $R^5$ is a cyclic hydrocarbon group;
 n1 is an integer of 1, 2, 3, 4, 5 or 6; and
 n2 is an integer of 1, 2, 3 or 4.

Advantageously, the ionic liquid of the invention may be an ionic liquid in which the cation is a cation of formula (I) and the anion is an anion of formula (IV) or an anion of formula (V) such as defined above.

Whilst paying heed to the above-mentioned conditions, when the groups $R^1$ to $R^4$ for formulas (I) and (II) and $R^1$ to $R^3$ for formula (III) correspond to an aliphatic hydrocarbon group, it may be an alkyl group.

More specifically, whilst paying heed to the above-mentioned conditions, when the groups $R^1$ to $R^4$ for formulas (I) and (II) and $R^1$ to $R^3$ for formula (III) correspond to an aliphatic hydrocarbon group, this may be an aliphatic hydrocarbon group having at least two carbon atoms such as an alkyl group.

Further specifically, the aliphatic hydrocarbon group having at least two carbon atoms may be a straight-chain or branched hydrocarbon group comprising 2 to 16 carbon atoms, such as an alkyl group i.e. an alkyl group of formula $CH_3$—$(CH_2)_n$— with n being an integer ranging from 1 to 15 (e.g. an n-octyl group).

More particularly, at least two of the groups $R^1$ to $R^4$ for the cations of formulas (I) and (II) and two of the groups $R^1$ to $R^3$ for the cations of formula (III) are aliphatic hydrocarbon groups having at least two carbon atoms such as defined above, and at least one of groups $R^1$ to $R^4$ for the cations of formulas (I) and (II) and one of groups $R^1$ to $R^3$ for the cations of formula (III) are a hydrogen atom, one specific example coming within this definition being the dioctylammonium cation of following formula (VII):

As mentioned above, $R^1$ to $R^4$ for formulas (I) and (II) and $R^1$ to $R^3$ for formula (III) may represent a cyclic hydrocarbon group, in the same way as $R^5$ represents a cyclic hydrocarbon group, provided evidently that heed is paid to the conditions set forth above relating to the groups $R^1$ to $R^4$ for formulas (I) and (II) and to groups $R^1$ to $R^3$ for formula (III).

Conventionally, by "cyclic hydrocarbon group" is meant any saturated or unsaturated hydrocarbon group formed of one or more hydrocarbon rings, the ring or rings comprising at least 3 carbon atoms.

If the group is a saturated cyclic hydrocarbon group, it may be a cyclopropyl, cyclobutyl, cyclopentyl, cyclohexyl, bicyclohexyl, bicyclodecyl group, etc.

If the group is an unsaturated cyclic hydrocarbon group, it may be an aromatic group and more specifically an aryl group.

Conventionally, by "aryl group" is meant a monocyclic or polycyclic group which meets Huckel's Rule, i.e. having a number of delocalised π electrons equal to 4n+2 (with n=0, 1, 2, 3, ...), this group possibly comprising at least 5 carbon atoms, for example 5 to 18 carbon atoms. As examples of aryl groups able to be used, mention can be made of cyclopentadienyl, phenyl, benzyl, biphenyl, pyrenyl, naphthalenyl, phenantrenyl and anthracenyl groups.

The cyclic hydrocarbon group, such as an aromatic group, may optionally be substituted which in other words means that one or more hydrogen atoms carried by the ring(s) are replaced by groups which for example can be selected from among halogen atoms, or alcohol, ether, amine, carboxylic acid, ester, nitrile, amide, nitro, thiol, thioester, silyl, phosphine or phosphoryl groups.

More specifically, $R^5$ may be a phenyl group such as a phenyl group optionally substituted for example by at least one nitro group —$NO_2$.

For example, the anion may be an anion of following formula (VI):

with n2 being such as defined above, for example n2 being 1 or 2.

When the anion comes within the definition of anions of formula (IV) above, it may meet the specific formula $S_4^{2-}$.

For example, an ionic liquid conforming to the invention is an ionic liquid in which the cation meets formula (VII) such as defined above and in which the anion is an anion of formula $S_4^{2-}$ or of formula (VI) such as defined above.

These ionic liquids can be used alone, or in a mixture with at least one organic solvent, to form an electrolyte.

If the ionic liquid is used in a mixture with at least one organic solvent, the invention therefore refers to a composition comprising at least one ionic liquid such as defined above and at least one organic solvent.

When used, the organic solvent can be selected from among nitriles, alcohols, amides, linear carbonates, cyclic carbonates.

More specifically, the organic solvent may be an amide solvent such as dimethylacetamide.

In addition, the compositions of the invention may comprise a lithium salt.

For example, the lithium salt can be selected from the group formed by $LiPF_6$, $LiClO_4$, $LiBF_4$, $LiAsF_6$, $LiCF_3SO_3$, $LiN(CF_3SO_2)_3$, $LiN(C_2F_5SO_2)$, lithium bis(trifluoromethylsulfonyl)imide (known under the abbreviation LiTFSI) LiN[$SO_2CF_3$]$_2$, lithium bis(oxalato)borate (known under the abbreviation LIBOB), lithium bis(fluorosulfonyl)imide (known under the abbreviation LiFSI), $LiPF_3(CF_2CF_3)_3$ (known under the abbreviation LiFAP), lithium trifluoromethanesulfonate (known under the abbreviation LiTf), lithium bis-trifluoromethanesulfonylimide (known under the abbreviation Lilm) and the mixtures thereof.

In the electrolyte, the lithium salt may be contained at a concentration ranging up to 5 M, for example 1 M.

In the compositions of the invention, the above-mentioned ionic liquid may be contained in an amount of at least 10% by mass relative to the total mass of the composition and may range up to 85% by mass relative to the total mass of the composition.

For example, a composition comprising as ionic liquid the ionic liquid of formula $[(C_8H_{17})_2N^+H_2]_2S_4^{2-}$ at a concentration of $4*10^{-2}$ mol/L in dimethylacetamide exhibits good conductivity of 1.8 mS/cm at 25° C. and low viscosity of 2.7 mPa·s at 25° C.

This composition also has a wide-ranging electroactivity domain e.g. ranging up to 3.6 V on a platinum electrode and up to 2 V on an activated carbon electrode.

More generally, the compositions of the invention containing a dimethylacetamide solvent may be ionic with conductivities possibly ranging from 1.8 mS/cm at 25° C. to 10 mS/cm at 80° C. and viscosity from 1.7 mPa·s at 80° C. to 2.7 mPa·s at 25° C.

The ionic liquids of the invention and the compositions containing the same can be prepared using an original method particularly involving the use of an intermediate ionic liquid having reducing and structuring capabilities, capable in particular of reducing sulfur or organic disulfide compounds to form ionic liquids conforming to the invention.

The invention therefore relates to a method to prepare an ionic liquid such as defined above, or a composition such as defined above, said method comprising the following steps:

a) a reaction step:

of an intermediate ionic liquid comprising the association:

of a cation selected from among the cations of following formulas (I) to (III):

where:
R$^1$ to R$^4$ for formulas (I) and (II), and R$^1$ to R$^3$ for formula (III) are such as defined above i.e. that R$^1$ to R$^4$ for formulas (I) and (II) and R$^1$ to R$^3$ for formula (III) are each independently a hydrogen atom or an aliphatic or cyclic hydrocarbon group, provided that at least one of groups R$^1$ to R$^4$ for formulas (I) and (II) and at least one of groups R$^1$ to R$^3$ for formula (III) represent an aliphatic hydrocarbon group having at least two carbon atoms, and at least one of groups R$^1$ to R$^4$ for formulas (I) and (II) and at least one of groups R$^1$ to R$^3$ for formula (III) represent a hydrogen atom; and of an anion capable of reducing sulfur S$_8$ or a compound of formula R$_5$—S—S—R$^5$, R$^5$ being such as defined above, said anion able to be selected from among formate, acetate, tartrate, ascorbate or oxalate anions;

with sulfur S$_8$ or a compound of formula R$^5$—S—S—R$^5$, R$^5$ being such as defined above, after which an ionic liquid is obtained comprising the association of a cation, selected from among the cations of formula (I), (II) or (III) such as defined above, and of an anion of formula (IV) or (V) such as defined above, with n2 equalling 1;

b) if it is desired to obtain an ionic liquid or a composition containing the same, said ionic liquid comprising the association of a cation, selected from among the cations of formula (I), (II) or (III), and of an anion of formula (V), with n2 equalling 2, an additional reaction step is performed of the ionic liquid obtained at step a) with sulfur S$_8$, on the understanding that the ionic liquid obtained at step a) is the one obtained with the compound of formula R$^5$—S—S—R$^5$.

Therefore, if it is desired to obtain an ionic liquid comprising the association of a cation, selected from among the cations of formula (I), (II) or (III) with an anion of formula (IV), according to the method of the invention this involves the reacting with sulfur S$_8$ of an intermediate ionic liquid comprising the association of a cation selected from among the cations of the above-defined formulas (I) to (III) with an anion such as defined above, namely an anion that can be selected from among formate, acetate, tartrate, ascorbate, oxalate anions.

The above-mentioned reaction, taking a cation of formula [R$_2$NH$_2$]$^+$ as example, can be schematised by the following chemical equation:

$$8[R_2NH_2^+][HCOO^-]+2S_8 \rightarrow 4[R_2NH_2^+]_2[S_4^{2-}]+8CO_2+4H_2$$

The reaction can be conducted in the presence of an organic solvent such as those mentioned above, in which case the result of the reaction is a composition comprising the ionic liquid conforming to the invention.

If it is desired to obtain an ionic liquid comprising the association of a cation selected from among the cations of formula (I), (II) or (III) with an anion of formula (V), with n$_2$ equalling 1, according to the method of the invention this concerns reacting with a R$^5$—S—S—R$^5$ compound an intermediate ionic liquid comprising the association of a cation selected from among the cations of formulas (I) to (III) defined above with a reducing anion such as defined above, selected for example from among formate, acetate, tartrate, ascorbate, oxalate anions.

The above-mentioned reaction, taking a cation of formula [R$_2$NH$_2$]$^+$ as example, can be schematised by the following chemical equation:

$$2[R_2NH_2^+][HCOO^-]+R^5-S-S-R^5 \rightarrow 2[R_2NH_2^+][R^5S^-]+2CO_2+H_2$$

The reaction can also be conducted in the presence of an organic solvent, such as those mentioned above, in which case the result of the reaction is a composition comprising the ionic liquid conforming to the invention.

Finally, if it is desired to obtain an ionic liquid comprising the association of a cation selected from among the cations of formula (I), (II) or (III) with an anion of formula (V), with n2 equalling 2, the method after step a) further comprises the implementing of an additional step b), whereby sulfur is reacted with the ionic liquid derived from step a), namely the ionic liquid comprising the association of a cation selected from among the cations of formula (I), (II) or (III) with an anion of formula (V) and with n2 equalling 1.

The above-mentioned reaction can be schematised by the following chemical equation:

$$[R_2NH_2^+][R^5S^-]+(1/8)S_8 \rightarrow [R_2NH_2^+][R^5S_2^-]$$

According to the method of the invention, the above-mentioned intermediate ionic liquid can be prepared previously.

For example, this intermediate ionic liquid can be previously prepared using a simple acid-base reaction according to the BrØnsted mechanism between a BrØnsted acid (e.g. formic acid, acetic acid, tartaric acid, ascorbic acid, oxalic acid) and a BrØnsted base the protonation of which provides the cations of above-mentioned formula (I), (II) or (III).

Therefore, this type of intermediate ionic liquid forms a protonic ionic liquid, which is used as reducing medium for the sulfur or for the above-mentioned disulfide compounds.

In general, the intermediate ionic liquids of the above-mentioned type may have a lamellar phase structure and outer appearance of a gel, which means that the anion having reducing properties is immobilised and has its reducing property exacerbated.

When the intermediate ionic liquid is contacted with sulfur or a disulfide compound such as defined above, it advantageously leads to a stoichiometric reduction of the sulfur or disulfide compound and thereby forms an ionic liquid conforming to the invention.

Having regard to the above-mentioned properties, in particular in terms of conductivity and viscosity, the ionic liquids of the invention and the compositions containing the same are capable of being used as electrolytes, in particular in an energy storage device, e.g. a lithium-sulfur rechargeable battery or a solar cell.

Figure 5:
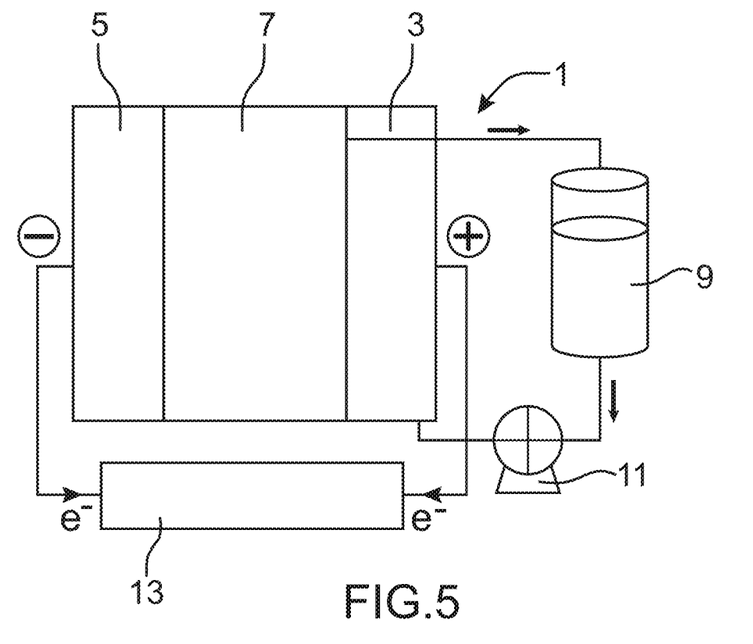
FIG. 5 is a cross-sectional view of a lithium-sulfur rechargeable battery conforming to the invention.

The invention therefore also relates to an energy storage device e.g. of lithium-sulfur rechargeable battery type as illustrated according to one particular embodiment in appended FIG. 5, comprising a cell 1 comprising a positive electrode 3 and a negative electrode 5 separated from each other by a separator 7 comprising, as electrolyte, an ionic liquid or composition conforming to the invention. In addition, the cell can be connected to a reservoir 9 which via a pump 11 allows conveying of the ionic liquid or composition of the invention to the separator. The cell is also connected to a charger 13 to conduct charging operations.

The positive electrode may be in a composite carbon/sulfur material and the negative electrode in a lithiated material e.g. a material containing metallic oxide(s) such as Li$_4$Ti$_5$O$_{12}$.

The invention will now be described with reference to the examples provided below given as non-limiting illustrations.

DETAILED DESCRIPTION OF PARTICULAR EMBODIMENTS

Example 1

This example illustrates the synthesis of a specific ionic liquid (dioctylammonium formate, abbreviated to DOAF), this ionic liquid being subsequently used as reducing agent of sulfur or organic disulfide compounds to produce an ionic liquid conforming to the invention.

Dioctylammonium formate (DOAF) meets the following formula:

This ionic liquid is synthesised via stochiometric reaction of dioctylamine (241 g, 1 mole) with formic acid (47 g, 1 mole), after which a white slightly yellow compound is formed having the appearance of a gel corresponding to dioctylammonium formate.

The yield obtained is close to 99%.

Example 2

This example illustrates the synthesis of an ionic liquid conforming to the invention: a dioctylammonium polysulfide (DOAPS).

A solution is initially prepared using a stoichiometric mixture of dimethylacetamide (in a proportion of 75% by mass relative to the total mass of the solution) with the ionic liquid prepared in Example 1 above (in a proportion of 25% by mass relative to the total mass of the solution).

The resulting solution is homogenised under ultrasound agitation for 15 minutes, after which a viscous yellow liquid solution is obtained.

Solid sulfur is added to this solution. The mixture is agitated, subjected to ultrasound and becomes bright red.

When symbolising dioctylammonium formate with the formula $[R_2NH_2]^+[HCOO]^-$ (R therefore corresponding to an n-octyl group), the synthesis reaction can be illustrated by the following chemical equation:

$$8[R_2NH_2^+][HCOO^-]+2S_8 \rightarrow 4[R_2NH_2^+]_2[S_4^{2-}]+ 8CO_2+^4H_2$$

In the light of the above chemical equation, it appears that this reaction does not generate any by-product in the sense that, aside from dioctylammonium polysulfide, only volatile products are formed (carbon dioxide and hydrogen respectively).

As a result, solely a highly concentrated solution of dioctylammonium polysulfide in dimethylacetamide is obtained.

This solution is bright red in colour, this colour possibly being attributed to absorption at 500 nm of the $S_8^{2-}$ ions, the initial step in the reduction of sulfur conforming to the chemical equation $(2S_8+4e^- \rightarrow 2S_8^{2-})$. In accordance with electrochemical reduction, the natural progress of this initial step is the dismutating of the $S_8^{2-}$ ions followed by a second reduction step to form the $S_4^{2-}$ ions in accordance with the chemical equation $(2S_8^{2-}+4e^- \rightarrow 4S_4^{2-})$.

The above-mentioned solution is subjected to electrochemical characterisation using two different electrochemical devices:

a first three-electrode device respectively comprising a carbon/sulfur electrode, a pseudo-reference electrode formed by a silver wire and a counter-electrode in lithium;

a second three-electrode device respectively comprising two activated carbon electrodes and a reference electrode in the form of a silver wire, the above-mentioned solution forming the electrolyte for both these devices.

Figure 1:
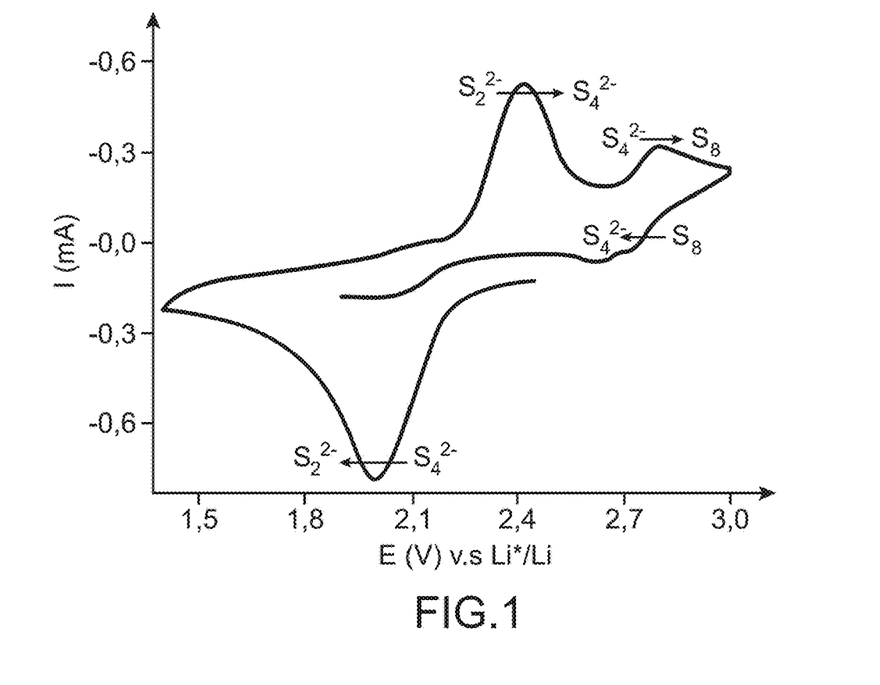
FIGS. 1 and 2 correspond to voltammograms obtained with the first device and second device respectively in Example 2.
Figure 2:
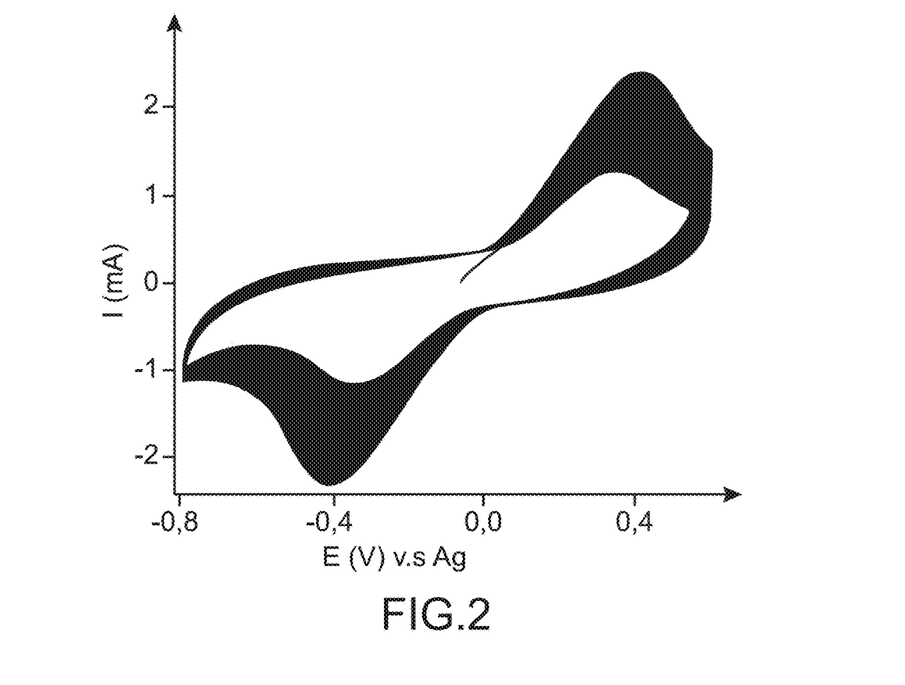

For each of these devices, the electrolyte was subjected to a cyclic voltammetry test using a Swagelock system, the results of this test being given respectively:

in FIG. 1 for the first device illustrating a voltammogram between 1.4 V and 3 V vs. $Li^+/Li$; and in FIG. 2 for the second device illustrating a voltammogram between −0.8 and 0.6 V in comparison with the silver pseudo-reference electrode.

The voltammogram obtained with the first device is characteristic of the stable polysulfide ions $S_4^{2-}$ in the ionic liquid.

The voltammogram obtained with the second device indicates a deposit of sulfur in the porosity of the carbon as evidenced by the gradual decrease of the cathode and anode peaks, this possibly allowing the envisaged use of this protocol to produce a composite carbon/sulfur electrode.

Example 3

This example illustrates the synthesis of an ionic liquid conforming to the invention: dioctylammonium 4-nitrophenylthiolate that can be symbolised by the formula $[(C_8H_{17})_2 NH_2]^+[4-NO_2PhS]^-$.

For this purpose, initially a solution is prepared with a stoichiometric mixture of dimethylacetamide (in a proportion of 75% by mass relative to the total mass of the solution) and the ionic liquid prepared in Example 1 above (in a proportion of 25% by mass relative to the total mass of the solution) i.e. 10 g of mixture obtained with 2.5 g of the above-mentioned ionic liquid and 7.5 g of dimethylacetamide.

The resulting solution is homogenised under ultrasound agitation for 15 minutes, after which a viscous yellow liquid solution is obtained.

To this solution there is added a stoichiometric amount of 4-nitrophenyldisulfide, i.e. 1.34 g of this compound per 10 g of solution. The mixture is agitated, subjected to ultrasound and becomes bright red.

When symbolising dioctylammonium formate with the formula $[R_2NH_2]^+[HCOO]^-$ and 4-nitrophenyldisulfide with formula $R^5$—S—S—$R^5$, the synthesis reaction can be illustrated by the following chemical equation:

$$2[R_2NH_2^+][HCOO^-]+R^5-S-S-R^5 \rightarrow 2[R_2NH_2^+] [R^5S^-]+2CO_2+H_2$$

Example 4

This example illustrates the synthesis of an ionic liquid conforming to the invention: dioctylammonium 2-nitrophenylthiolate that can be symbolised by the formula $[(C_8H_{17})_2 NH_2]^+[2-NO_2PhS]^-$.

Initially a solution is prepared with a stoichiometric mixture of dimethylacetamide (in a proportion of 75% by mass relative to the total mass of the solution) and the ionic liquid prepared in Example 1 above (in a proportion of 25% by mass relative to the total mass of the solution), i.e. 10 g of mixture obtained with 2.5 g of the above-mentioned ionic liquid and 7.5 g of dimethylacetamide.

The resulting solution is homogenised under ultrasound agitation for 15 minutes, after which a viscous yellow liquid solution is obtained.

To this solution there is added a stoichiometric amount of 2-nitrophenyldisulfide. The mixture is agitated, subjected to ultrasound and becomes deep blue.

When symbolising dioctylammonium formate with formula $[R_2NH_2]^+[HCOO]^-$ and 2-nitrophenyldisulfide with formula $R^5$—$S\_S$—$R^5$, the synthesis reaction can be illustrated by the following chemical equation:

Under the effect of light (UV in particular), the solution loses its colour after an exposure time of 1 to 2 minutes.

Without UV application and away from light, the colour is restored to the solution after 8 to 10 minutes.

Example 5

This example illustrates the synthesis of an ionic liquid conforming to the invention: dioctylammonium 4-nitrophenyldithiolate that can be symbolised by the formula $[(C_8H_{17})_2 NH_2]^+[4-NO_2PhS_2]^-$.

This ionic liquid is obtained by adding sulfur $S_8$ to the ionic liquid obtained in Example 3.

More specifically, 0.139 g of sulfur $S_8$ is added to 10 g of ionic liquid obtained in Example 3, followed by sonication treatment, after which dioctylammonium 4-nitrophenyldithiolate is obtained.

When symbolising dioctylammonium 4-nitrophenylthiolate with the formula $[(C_8H_{17})_2NH_2]^+[4-NO_2PhS]^-$ the synthesis reaction can be illustrated by the following chemical equation:

In solution in dimethylacetamide, the ionic liquid varies in colour as a function of time.

Example 6

In this example, the ionic liquid prepared in Example 2 (DOAPS) is used as electrolyte in rechargeable batteries of carbon/sulfur type.

Each rechargeable battery comprises a single cell comprising a positive carbon/sulfur electrode and a negative electrode having $Li_4Ti_5O_{12}$ as active material.

To produce the positive carbon/sulfur electrode 10 g of sulfur $S_8$, 15 g of carbon black and 5 g of polyvinylidene fluoride are mixed together. When mixed, 30 g of acetone are added and after homogenisation and evaporation of the acetone until a viscous solution is obtained, the mixture is cast on coating equipment to a thickness of about 500 micrometers and dried at ambient temperature to obtain a self-supported film. The film is then cut into discs of diameter 1 cm to be used as positive electrode. These are used to obtain a disc having an amount of sulfur of 32 mg (to form the positive electrode of the rechargeable battery in the first test described below) and a disc having an amount of sulfur of 18 mg (to form the positive electrode of the rechargeable battery in the second test described below).

The negative electrode whether for the first test or second test, was a commercial electrode in pellet form comprising 85% of active material, 10% acetylene black and 10% polyvinylidene fluoride with a copper collector.

To form a rechargeable battery, the positive electrode and negative electrode were separated using a Watman separator impregnated with the ionic liquid prepared in Example 2, to which 1 M LiTFSI had been added i.e. one mole of LiTFSI per one liter of above-mentioned ionic liquid.

Tests were performed on the resulting rechargeable batteries, in particular by varying applied current and working voltage using a three-electrode Swagelock system.

For the first test with the rechargeable battery comprising a positive electrode such as defined above with sulfur content of 32 mg, when a charge current of −60 mA and discharge current of +60 mA were applied, the system cycled between −0.35 V and +0.65 V (i.e. a potential difference of 1 V) with a charge/discharge rate of 1 hour (i.e. rate C).

From these values, it is possible to characterize the rechargeable battery in power densities and energy density which, for this first test, were 1.8 kW/kg and 1.8 kWh/kg respectively.

Figure 3:
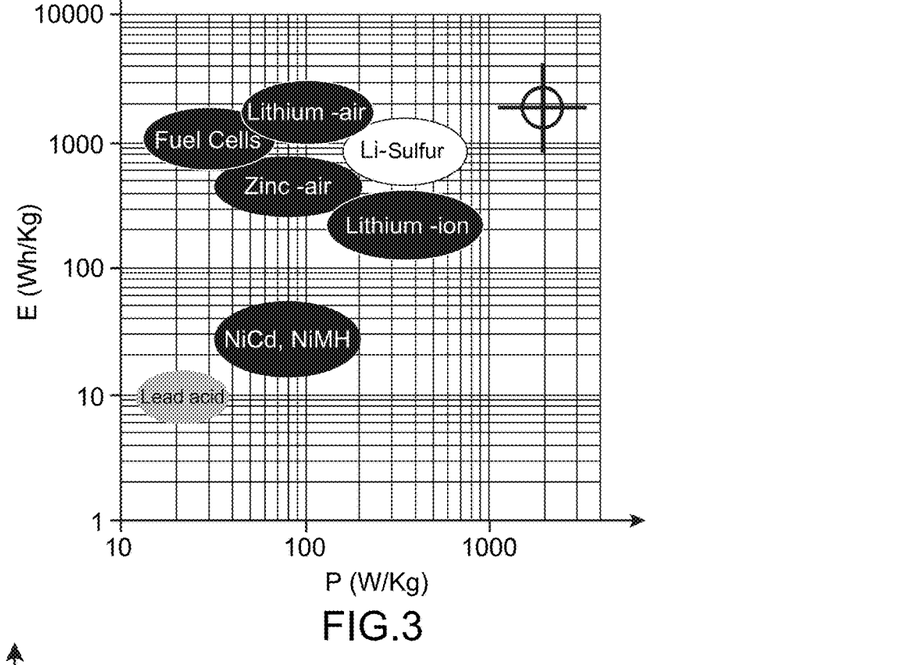
FIG. 3 is a Ragone chart illustrating the positioning of one of the rechargeable batteries prepared in Example 6.

From these values, it is possible to position the rechargeable battery on a Ragone chart which, for different systems, illustrates the changes in gravimetric energy density E (in Wh/kg) as a function of power density P (in W/kg). The purpose of this chart is to compare the rechargeable battery of the invention with other electrical energy storage systems such as lithium-ion, lithium-air, lithium-sulfur, zinc-air rechargeable batteries, fuel cells, NiCd, NiMH or lead-acid batteries, as illustrated in appended FIG. 3. It is clearly apparent that the rechargeable battery in the first test has higher power density and energy density than the electrical energy storage systems listed above.

At a second test with the rechargeable battery comprising a positive electrode such as defined above with sulfur content of 18 mg, when a charge current of −24 mA and discharge current of +24 mA were applied, the system cycled between −0.35 V and +0.65 V (i.e. a potential difference of 1 V) with a charge/discharge rate of C/2.

From these values, it is possible to characterize the rechargeable battery in terms of power densities and energy density, these being 1.2 kW/kg and 2.4 kWh/kg respectively in the second test, allowing the rechargeable battery of the second test to be ranked above the above-listed storage systems in terms of performance.

Figure 4:
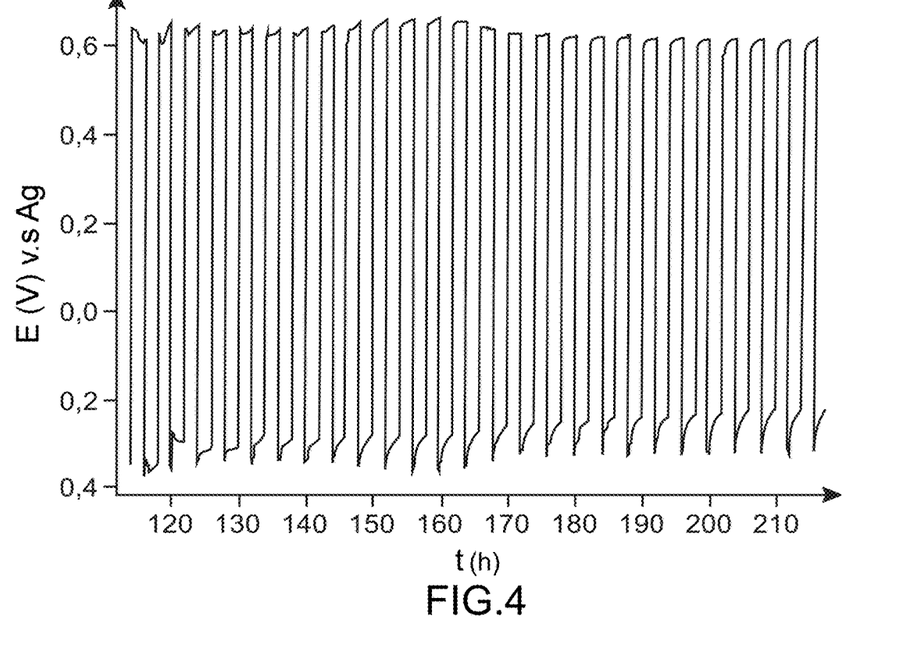
FIG. 4 is a graph illustrating the changes in potential E (in V) (expressed relative to a silver electrode) as a function of time (in hours) when conducting galvanostatic tests with one of the rechargeable batteries prepared in Example 6.

In addition, with the rechargeable battery in the second test it was able to be shown, when conducting galvanostatic tests, that it exhibits remarkable cyclability and efficiency having more than 5000 cycles without loss of capacity, as evidenced in appended FIG. 4, this Figure illustrating the changes in potential E (in V) (expressed relative to a silver electrode) as a function of time (in hours).

To summarise, with the rechargeable batteries the advantages prove to be numerous:
  they are of low cost and easy design;
  they have strong power densities and strong energy densities, higher than those of numerous electrical energy storage systems;
  they have remarkable cyclability and efficiency; and
  they can withstand strong charge rates (such as C/5, C/2, C, 2C, 5C).

The invention claimed is:

1. An ionic liquid comprising the association of a cation selected from among cations of following formula (I):

(I)

with an anion selected from among the anions of following formula (V):

(V)

where:
  $R^1$ to $R^4$ are each independently a hydrogen atom or an aliphatic or cyclic hydrocarbon group, provided that at least one of groups $R^1$ to $R^4$ represents an aliphatic hydrocarbon group having at least two carbon atoms, and at least one of groups $R^1$ to $R^4$ represents a hydrogen atom;
  $R^5$ is a cyclic hydrocarbon group; and
  n2 is an integer equaling 1, 2, 3 or 4.

2. The ionic liquid according to claim 1, wherein when the groups $R^1$ to $R^4$ correspond to an aliphatic hydrocarbon group, the groups correspond to an aliphatic hydrocarbon group having at least two carbon atoms.

3. The ionic liquid according to claim 1, wherein the aliphatic hydrocarbon group having at least two carbon atoms is a straight-chain or branched hydrocarbon group having 2 to 16 carbon atoms.

4. The ionic liquid according to claim 1, wherein the aliphatic hydrocarbon group having at least two carbon atoms is an alkyl group of formula $CH_3-(CH_2)_n-$ with n being an integer ranging from 1 to 15.

5. The ionic liquid according to claim 1, wherein at least two of groups $R^1$ to $R^4$ are aliphatic hydrocarbon groups having at least two carbon atoms, and at least one of groups $R^1$ to $R^4$ is a hydrogen atom.

6. The ionic liquid according to claim 1, wherein the cation is a cation of following formula (VII):

(VII)

7. The ionic liquid according to claim 1, wherein $R^5$ is an aromatic group.

8. The ionic liquid according to claim 1, wherein $R^5$ is an optionally substituted aryl group.

9. The ionic liquid according to claim 1, wherein $R^5$ is an optionally substituted phenyl group.

10. The ionic liquid according to claim 1, wherein $R^5$ is a phenyl group substituted by at least one nitro group.

11. The ionic liquid according to claim 1, wherein the anion is an anion of following formula (VI):

(VI)

with n2 as defined in claim 1.

12. The ionic liquid according to claim 6, wherein the cation meets formula (VII) and wherein the anion is an anion of formula (VI):

(VI)

wherein n2 is an integer equaling 1, 2, 3 or 4.

13. The ionic liquid according to claim 1, that is an electrolyte.

14. A composition comprising at least one ionic liquid according to claim 1 and at least one organic solvent.

15. The composition according to claim 14, wherein the organic solvent is an amide solvent.

16. The composition according to claim 14, that is an electrolyte.

17. A method to prepare an ionic liquid
  comprising the association of a cation selected from among cations of following formulas (I) to (III):

(I)

(II)

(III)

with an anion selected from among the anions of following formulas (IV) and (V):

(IV)

(V)

where:
  $R^1$ to $R^4$ for formulas (I) and (II) and $R^1$ to $R^3$ for formula (III) are each independently a hydrogen atom or an aliphatic or cyclic hydrocarbon group, provided that at least one of groups $R^1$ to $R^4$ for formulas (I) and (II), and at least one of groups $R^1$ to $R^3$ for formula (III) represents an aliphatic hydrocarbon group having at least two carbon atoms, and at least one of groups $R^1$ to $R^4$ for formulas (I) and (II) and at least one of groups $R^1$ to $R^3$ for formula (III) represents a hydrogen atom;

$R^5$ is a cyclic hydrocarbon group;

n1 is an integer equaling 1, 2, 3, 4, 5 or 6; and n2 is an integer equaling 1, 2, 3 or 4, or a composition comprising said ionic liquid and at least one organic solvent, said method comprising the following steps:

a) a reaction step:

of an intermediate ionic liquid comprising the association:

of a cation selected from among the cations of following formulas (I) to (III):

and of an anion capable of reducing sulfur $S_8$ or a compound of formula $R^5$—S—S—$R^5$, wherein $R^5$ is a cyclic hydrocarbon group; with sulfur $S_E$ or a compound of formula $R^5$—S—S—$R^5$, after which an ionic liquid is obtained comprising the association of a cation selected from among the cations of formulas (I), (II) or (III) and of an anion of formula (IV) or (V) with n2 equaling 1; and b) if it is desired to obtain an ionic liquid or composition comprising the same, said ionic liquid comprising the association of a cation selected from among the cations of formula (I), (II) or (III) and an anion of formula (V), with n2 equaling 2, performing an additional reaction step of the ionic liquid obtained at step a) with sulfur $S_8$, if the ionic liquid obtained at step a) is the one obtained with the compound of formula $R^5$—S—S—$R^5$.

18. The method according to claim 17, wherein the anion is selected from among formate, acetate, tartrate, ascorbate, oxalate anions.

19. The method according to claim 17 further comprising a prior preparation step of the intermediate ionic liquid.

20. An energy storage device comprising at least one cell comprising a positive electrode and a negative electrode separated from each other by a separator comprising, as electrolyte, an ionic liquid as defined in claim 13 or a composition comprising an ionic liquid as defined in claim 13 and at least one organic solvent.

21. The energy storage device according to claim 20 that is a lithium-sulfur rechargeable battery.

22. A solar cell comprising, as electrolyte, an ionic liquid as defined in claim 13 or a composition comprising an ionic liquid as defined in claim 13 and at least one organic solvent.

* * * * *